United States Patent [19]

Barth

[11] 4,099,083

[45] Jul. 4, 1978

[54] DISPLAY PANEL WITH INTEGRAL RIGID LEADS

[75] Inventor: Edward G. Barth, Union, N.J.

[73] Assignee: Burroughs Corporation, Detroit, Mich.

[21] Appl. No.: 793,957

[22] Filed: May 5, 1977

[51] Int. Cl.² .............................................. H01J 61/06
[52] U.S. Cl. .................................. 313/217; 313/238; 313/292; 313/331; 313/332
[58] Field of Search .............. 313/217, 238, 292, 331, 313/332

[56] References Cited

U.S. PATENT DOCUMENTS 4,047,066  9/1977  Kobayakawa et al. .............. 313/217

Primary Examiner—Rudolph V. Rolinec
Assistant Examiner—Darwin R. Hostetter
Attorney, Agent, or Firm—Kevin R. Peterson; Robert A. Green; Edward J. Feeney, Jr.

[57] ABSTRACT

A display panel includes a base plate and face plate having internal electrodes connected to contact pads disposed along an edge of the panel. The base plate and face plate are spaced apart along said edge of the panel so that flexible terminals or pins can be inserted therebetween to make contact with the contact pads and to connect the internal panel electrodes to external circuitry. The panel includes means for mechanically supporting all of the leads and for cementing the leads to the support member, thus providing a rigid lead assembly which can be handled with ease by a user.

10 Claims, 6 Drawing Figures

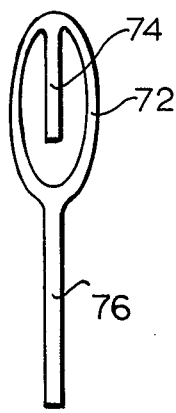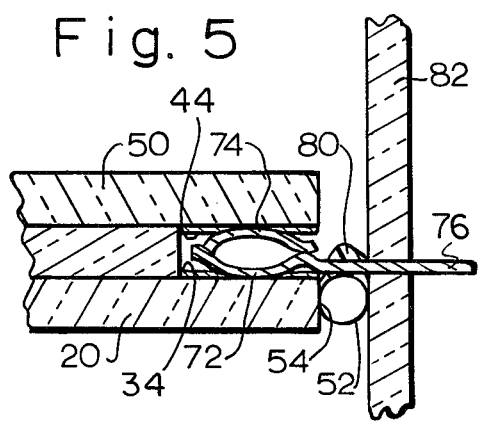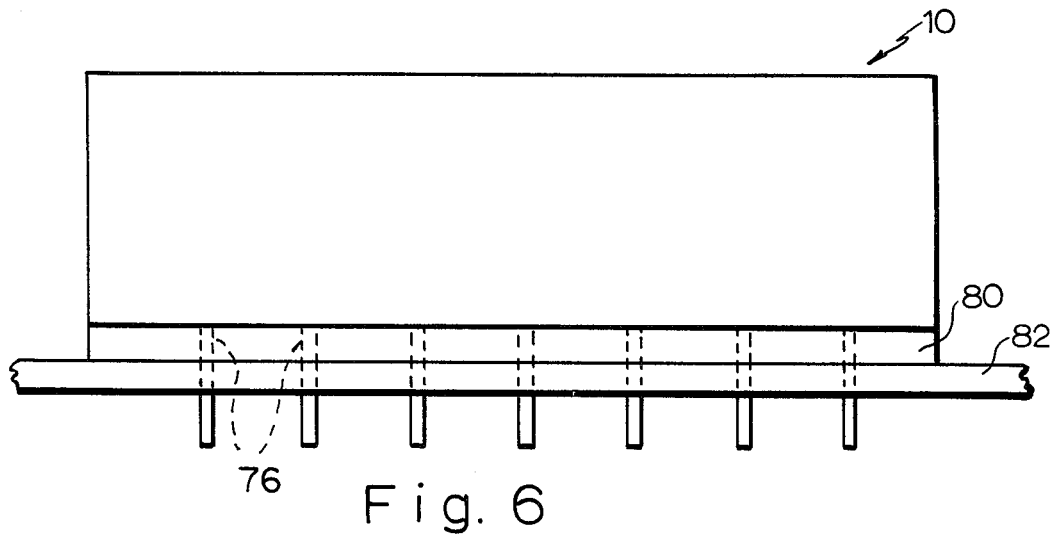

DISPLAY PANEL WITH INTEGRAL RIGID LEADS

BACKGROUND OF THE INVENTION

Display panels of the type under consideration, known as PANAPLEX panels, have been sold commercially for many years. These panels include a gas-filled envelope made up of a base plate and a face plate hermetically sealed together with a small gap between them along one edge of the panel. The electrodes within the panel are connected by conductive runs to contact pads, some on the base plate and some on the face plate, along the aforementioned edge of the panel, and elongated, flexible, metallic terminals are inserted in the space between the base plate and face plate to make contact with the contact pads. For optimum utility, it is necessary to convert the terminals into a rigid, unitary assembly, and, in the prior art, for this purpose, a plastic header was provided into which the terminals were inserted. The plastic header served as a rigid connector socket, and it permitted the terminals to be inserted as a rigid unit into a printed circuit board or the like. Such a connector socket is undesirably expensive and space-consuming, and for many years, attempts have been made to attach the leads directly to the display panel to form the unitary, rigid assembly and thus eliminate the need for a separate connector socket. Up to now, such attempts have not been successful.

SUMMARY OF THE INVENTION

The present invention solves the problems of the prior art, in brief, by providing a display panel carrying a series of individual flexible leads and having an auxiliary support member for supporting the leads, a cement being provided to cement the leads to the auxiliary support means to, in effect, form the leads into a unitary, rigid assembly which can be handled and manipulated by a user.

DESCRIPTION OF THE DRAWINGS

FIG. 4 is a plan view of a terminal or pin used with the panel of FIG. 1;

FIG. 5 is a sectional elevational view of a portion of the panel of FIG. 1 showing a terminal in place; and FIG. 6 is a plan view of the apparatus of FIG. 5 showing the relationship of a plurality of terminals to the display panel.

DESCRIPTION OF THE PREFERRED EMBODIMENTS

The present invention utilizes some of the principles set forth in U.S. Pat. No. 3,868,676 and relates to a PANAPLEX display panel of the type made and sold by Burroughs Corporation. The panel is described and shown schematically and in only enough detail to illustrate the invention. Specific details of such a panel can be found, for example, in U.S. Pat. No. 3,787,940, which is incorporated herein by reference along with U.S. Pat. No. 3,868,676.

Figure 1:
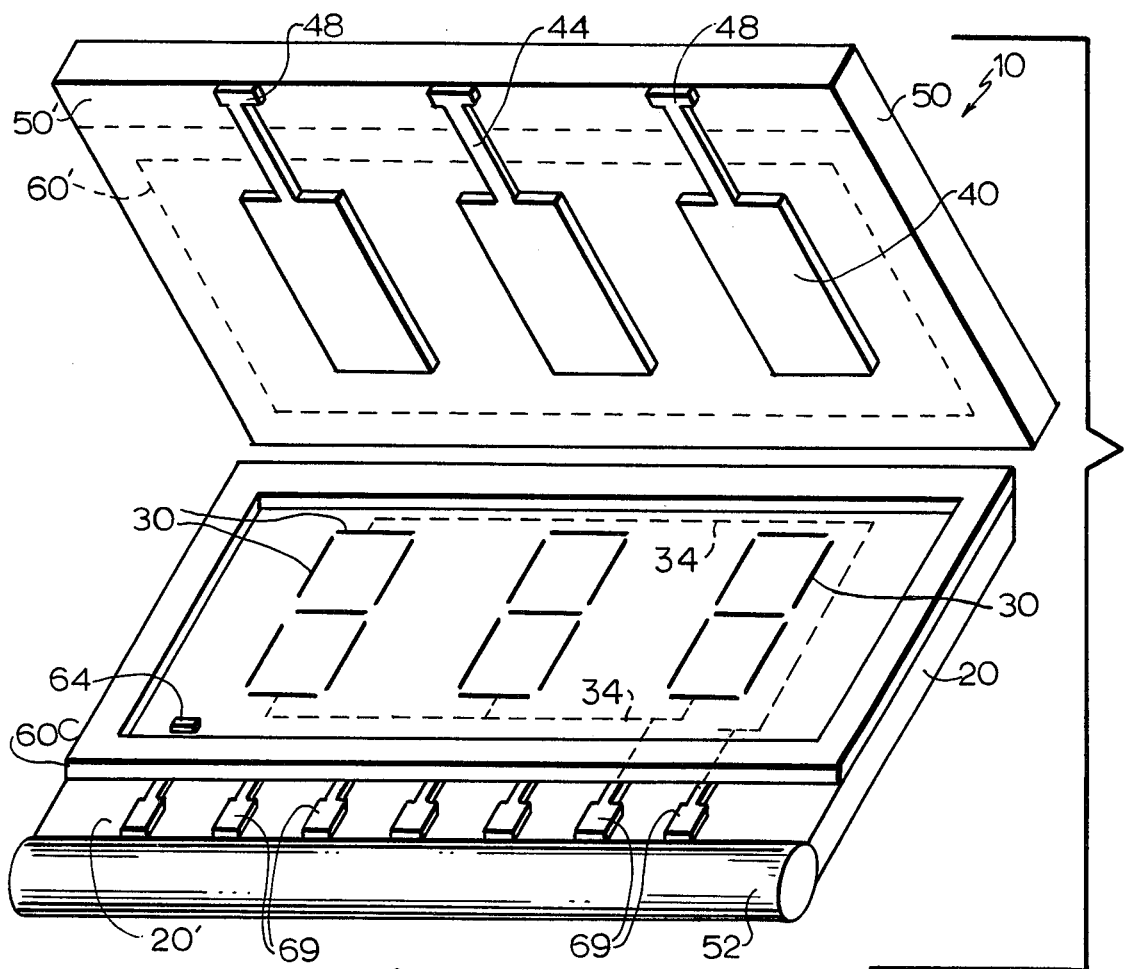
FIG. 1 is a perspective exploded view of a display panel embodying the invention.
Figure 2:
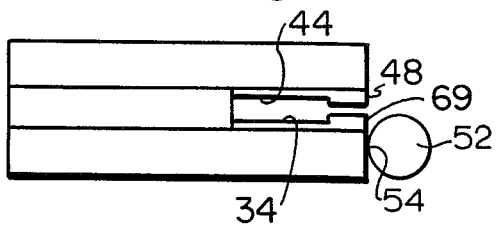
FIG. 2 is a side elevational view of the panel of FIG. 1 shown assembled.

Referring to the drawings and to FIGS. 1 and 2, a display panel 10 embodying the invention includes an envelope made of a base plate 20 of glass, ceramic, or the like, and a face plate 50 of glass. The base plate 20 carries a plurality f groups of cathode electrodes 30 in the form of segments, shown schematically, which are adapted to be energized in different combinations to display characters, as is well known in the art. The cathode groups define the display area of the panel. The base plate also carries conductor runs 34 (only some of which are shown) for the cathode electrodes and one or more insulating layers 36, as required, to insulate the leads from each other or from other panel elements. Each run 34 is connected to the same corresponding cathode in each group of cathodes.

The panel 10 also includes an anode electrode 40 for each group of cathode electrodes, and, in one arrangement, the anodes comprise thin films of conductive material, such as tin oxide, formed on the lower surface of the face plate 50. A glass or metal mercury capsule 64 is also provided within the panel.

The panel 10 is filled with an ionizable gas such as neon, xenon, argon, or the like, singly or in combination, at a suitable pressure to support cathode glow.

In panel 10, the base plate and face plate are of the same size and shape, and they are hermetically sealed together by a rectangular frame 60 of glass frit sealing material. In FIG. 1, the sealing frame is shown seated on the base plate, and the dash lines 60' on the face plate show the portion of the face plate covered by the sealing ring when the panel is assembled. As shown in FIGS. 1 and 2, the front ends of the base plate and face plate extend beyond the sealing frame to provide projecting portions 20' and 50', respectively.

According to the invention, a rod 52 of glass, preferably of the same characteristics as the base plate, is secured to the front edge 54 of the base plate using a suitable insulating cement.

Figure 3:
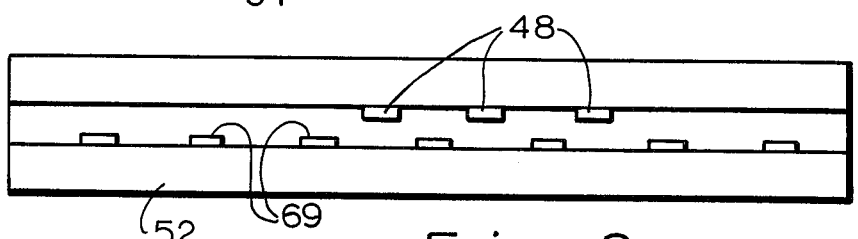
FIG. 3 is a front elevational view of the panel of FIG. 1 shown assembled.

The conductive runs 34 which are connected to the cathodes 30 extend under insulating layer 36 to just beyond portion 60C of the sealing frame at the front edge of the base plate and of the panel, and they terminate in conductive pads 69 which are spaced apart along the top surface portion 20' of the base plate just outside the sealing frame 60 and just beneath the overhanging portion 50' of the face plate. The anode electrodes 40 also include runs 44 which extend directly to the edge of the face plate where they terminate in conductive pads 48 suitably spaced apart along said edge just outside the sealing frame 60. The series of cathode and anode contact pads overlay each other, as seen in FIG. 2, but the cathode pads are offset from the anode pads, as seen in FIG. 3, so that a terminal (to be described) which is in contact with one pad in the space between the base plate and face plate cannot touch another contact pad above or below it.

The panel 10 utilizes external terminals or pins 70 of the type shown in U.S. Pat. No. 3,868,676 and shown schematically in FIG. 4. One pin 70 is provided for each of the contact pads 48 and 69, and all of the pins include a head portion which comprises an annular metal strip 72 and a central strip 74 which are bent convexly and in opposite directions to impart resiliency thereto. The strips 72 and 74 are compressed and put under tension when the head portion of the pin is inserted into the space between the base plate and face plate, with the strip 72 bearing against the base plate and strip 74 bearing against the face plate. The pressure or tension thus produced holds each terminal against a contact pad to provide electrical continuity. Each pin also includes a lead portion 76 which extends from the head and away from the panel. All of the lead portions 76 lie close to or lie on the surface of the glass rod 52 (FIGS. 5 and 6), and they are all secured to the rod by a suitable insulating cement 80 which extends, as a line, along the surface of the rod 68 of the base plate. The cement secures all of the pins to the rod and thus forms a rigid unitary assembly which can be inserted directly into a printed circuit board 82 or the like.

Various modifications of the apparatus described above will occur to those skilled in the art. It is noted, for example, that the rod 52 may have any suitable shape, and it may be made of any suitable insulating material. It may also be secured to the face plate, rather than the base plate, with the terminals or pins 70 secured thereto in the manner described.

What is claimed is:

1. A display panel comprising
   a gas-filled envelope including a base plate and face plate hermetically sealed together by a seal to form said envelope, with portions of said base plate and face plate extending beyond said seal to define one edge of said panel,
   a plurality of electrodes within said envelope and conductive runs extending from said electrodes through said seal to the exterior of said envelope where they terminate in contact pads, said contact pads being disposed outside said envelope on said portions of said base plate and face plate,
   an auxiliary member secured to the edge of one of said plates and extending along said edge of said panel to provide a support surface, said support surface being of insulating material,
   a flexible terminal in electrical contact with each contact pad and seated on said auxiliary member as a support surface, and
   an insulating cement securing said terminals to said support surface to form a rigid assembly thereof.

2. The panel defined in claim 1 wherein said base plate and face plate are hermetically sealed together by a sealing ring disposed between said base plate and face plate.

3. The panel defined in claim 1 wherein both said base plate and face plate extend beyond said seal outside said envelope, and said auxiliary member is an insulating rod secured to one of said plates, and said cement secures said terminals to said insulating rod.

4. The panel defined in claim 1 wherein adjacent portions of said base plate and face plate extend beyond said seal, said adjacent portions being spaced apart to provide a space between them, said contact pads being disposed along said adjacent portions, and said terminals being positioned in the space between said base plate and face plate.

5. The panel defined in claim 3 wherein said one of said plates is said base plate.

6. The panel defined in claim 3 wherein said one of said plates is said face plate.

7. The panel defined in claim 1 wherein said auxiliary member is a glass rod.

8. A display panel comprising
   a gas-filled envelope including a base plate and a face plate,
   a seal hermetically sealing together said base plate and face plate with adjacent portions of said base plate and said face plate extending beyond said seal, said adjacent portions of said base plate and face plate being spaced apart to provide a space between them,
   contact pads disposed along said adjacent portions of said base plate and face plate,
   an insulating rod secured to one of said plates of said envelope,
   a plurality of electrodes within said envelope electrically connected to said contact pads,
   flexible terminals disposed within said space, each in contact with a contact pad, and
   a cement securing said terminals to said insulating rod to form a rigid assembly thereof.

9. The panel defined in claim 8 wherein said insulating rod is secured to the front edge of said base plate.

10. The panel defined in claim 8 wherein said insulating rod is secured to the front edge of said face plate.

* * * * *